United States Patent
Kim et al.

(10) Patent No.: US 10,805,046 B2
(45) Date of Patent: Oct. 13, 2020

(54) APPARATUS AND METHOD USING POLAR CODE FOR MULTIPLE INPUT MULTIPLE OUTPUT (MIMO) CHANNEL

(71) Applicant: SAMSUNG ELECTRONICS CO., LTD., Suwon-si, Gyeonggi-Do (KR)

(72) Inventors: Kwang-chul Kim, Seongnam-si (KR); Samir Kumar Mishra, Karnataka (IN); Alok Jain, Karnataka (IN); Prince Arya, Karnataka (IN); Puneet Pandey, Karnataka (IN)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 3 days.

(21) Appl. No.: 16/236,837

(22) Filed: Dec. 31, 2018

(65) Prior Publication Data

US 2019/0238268 A1 Aug. 1, 2019

(30) Foreign Application Priority Data

Jan. 30, 2018 (KR) .................. 10-2018-0011406

(51) Int. Cl.
| | | |
|---|---|---|
| H03M 13/00 | (2006.01) | |
| H04L 1/00 | (2006.01) | |
| H04B 7/0413 | (2017.01) | |
| H03M 13/13 | (2006.01) | |

(52) U.S. Cl.
CPC .......... *H04L 1/0058* (2013.01); *H03M 13/13* (2013.01); *H04B 7/0413* (2013.01)

(58) Field of Classification Search
CPC ..... H04L 1/0058; H04B 7/0413; H03M 13/13
See application file for complete search history.

(56) References Cited

U.S. PATENT DOCUMENTS

| | | |
|---|---|---|
| 9,479,291 B2 | 10/2016 | Mahdavifar et al. |
| 9,628,114 B2 | 4/2017 | Huang et al. |
| 9,768,915 B2 | 9/2017 | Kim et al. |
| 2015/0194987 A1 | 7/2015 | Li et al. |
| 2017/0181104 A1 | 6/2017 | Jang et al. |

(Continued)

FOREIGN PATENT DOCUMENTS

| | | |
|---|---|---|
| KR | 10-1327505 | 11/2013 |
| KR | 1020170054046 | 5/2017 |

OTHER PUBLICATIONS

Arikan, Erdal, "Channel polarization: A method for Constructing Capacity-Achieving Codes for Symmetric Binary-Input Memoryless Channels," IEEE Transactions on Information Theory 55, No. 7 (Jul. 2009), pp. 3051-3073.

(Continued)

*Primary Examiner* — Samir W Rizk
(74) *Attorney, Agent, or Firm* — F. Chau & Associates, LLC

(57) ABSTRACT

A method of constructing a polar code for a multiple input multiple output (MIMO) channel. The method may generate a plurality of mutually independent single input single output (SISO) channels based on MIMO channel information; define channels of the polar code; allocate each of the channels of the polar code to one of the plurality of the SISO channels; estimate qualities of channels combined by applying polar transformation to the plurality of SISO channels; and arrange unfrozen bits and frozen bits based on the estimated qualities.

19 Claims, 12 Drawing Sheets

(56) References Cited

U.S. PATENT DOCUMENTS

2017/0324514 A1 11/2017 Shen et al.
2018/0226999 A1* 8/2018 Wang ................ H03M 13/2963
2019/0393987 A1* 12/2019 Hong ................. H03M 13/356

OTHER PUBLICATIONS

Wang X. et al., "On the Polar Codes for MIMO," IEEE International Conference on Wireless Communications & Signal Processing (WCSP), (2013), 5 pages.

Mahdavifar, Hessam, et al., "Compound polar codes", Information Theory and Application Workshop (ITA), 2013. IEEE, (2013), (6 pages).

Kim J, Lee J., "Polar codes for non-identically distributed channels", EURASIP Journal on Wireless Communications and Networking. Dec. 1, 2016;2016(1):287 (17 pages).

* cited by examiner

APPARATUS AND METHOD USING POLAR CODE FOR MULTIPLE INPUT MULTIPLE OUTPUT (MIMO) CHANNEL

CROSS-REFERENCE TO RELATED APPLICATION

This application claims the benefit of Korean Patent Application No. 10-2018-0011406, filed on Jan. 30, 2018, in the Korean Intellectual Property Office, the disclosure of which is incorporated herein by reference in its entirety.

BACKGROUND

Technical Field

This disclosure relates generally to channel coding in data communications over noisy channels to reduce communication errors. More particularly, it relates to an apparatus and method utilizing a polar code for a multiple input multiple output (MIMO) channel.

Discussion of the Related Art

Channel coding may improve reliability of data transmission by adding redundancy. A relatively new channel encoding method called "polar coding" is a coding technique that forms polarized virtual "bit-channels" using a class of block codes that contain polar codes. The bit channels are categorized into "good channels" in which data may be transmitted with high reliability, and "bad channels" which are low reliability channels. A polar coding method may substantially achieve Shannon capacity (the highest information rate achievable with arbitrary small error probability) by using low encoding/decoding complexity. In addition, MIMO may be used to improve the capacity and the reliability of a channel. Accordingly, in a system that integrates polar coding and MIMO, efficient application of the polar code in a MIMO channel is desirable.

SUMMARY

Disclosed are apparatus and methods of constructing and using a polar code for a multiple input multiple output (MIMO) channel.

According to an aspect of the inventive concept, there is provided a method of constructing a polar code for a multiple input multiple output (MIMO) channel. The method includes: generating a plurality of mutually independent single input single output (SISO) channels based on MIMO channel information; executing, by at least one processor, operations comprising: defining channels of the polar code and allocating each of the polar code channels to one of the plurality of the SISO channels; estimating qualities of channels combined by applying polar transformation to the plurality of SISO channels; and arranging unfrozen bits and frozen bits based on the estimated qualities.

According to another aspect of the inventive concept, there is provided a communication method via a multiple input multiple output (MIMO) channel, the communication method including executing, by at least one processor, operations comprising: obtaining MIMO channel information; constructing a polar code based on the MIMO channel information; and performing encoding or decoding according to the polar code, wherein the constructing of the polar code, includes allocating each of N channels of the polar code to one of r layers of the MIMO channel, where N and r are positive integers.

According to another aspect of the inventive concept, there is provided a communication device communicating via a multiple input multiple output (MIMO) channel, the communication device including: a polar code constructor circuit configured to construct a polar code based on MIMO channel information; an encoder circuit configured to generate, N-bit code data by polar coding K-bit source data based on the polar code; and an interleaver circuit configured to generate interleaved data comprising r groups corresponding to r layers of the MIMO channel by interleaving the code data based on the polar code, where K, N and r are each positive integers.

A non-transitory computer-readable recording medium may store instructions that, when executed by at least one processor, implement the method of constructing the polar code or the communication method summarized above.

BRIEF DESCRIPTION OF THE DRAWINGS

Embodiments of the inventive concept will be more clearly understood from the following detailed description taken in conjunction with the accompanying drawings in which like reference characters denote like elements or functions, wherein.

DETAILED DESCRIPTION OF EMBODIMENTS

Figure 1:
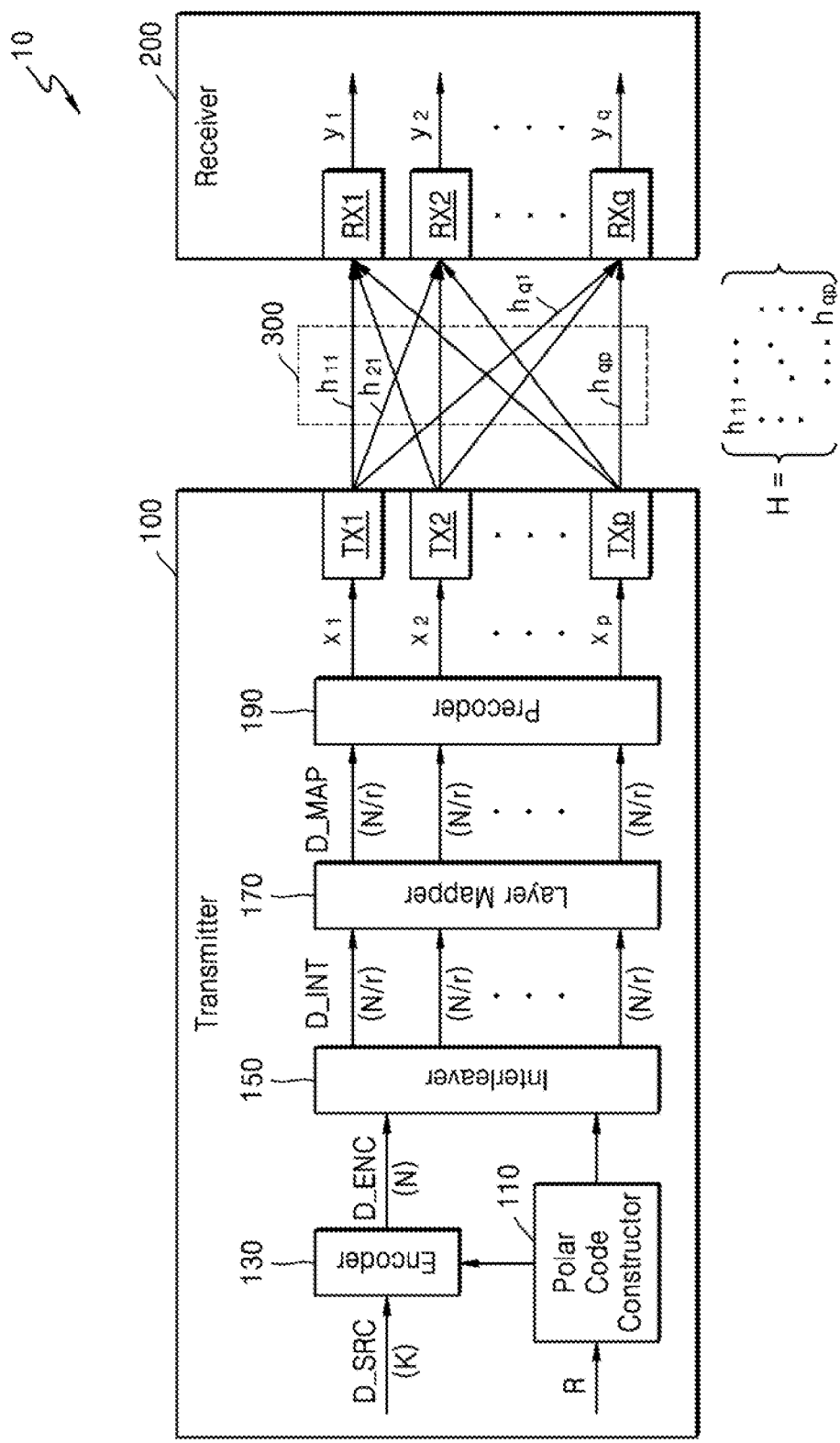
FIG. 1 is a block diagram illustrating a communication system according to an embodiment.

FIG. 1 is a block diagram illustrating a data communication system 10 including a transmitter 100 and a receiver 200 according to an embodiment. Transmitter 100 and the receiver 200 may communicate with each other via a multiple input multiple output (MIMO) channel 300. In the following description, variables representing a number or indices are positive integers unless otherwise specified.

The system 10 may be any communication system that may benefit from a MIMO based signal exchange over the MIMO channel 300. In some embodiments, the system 10 may be, as a non-limiting example, a wireless communication system such as a 5th generation (5G) wireless system, a long term evolution (LTE) system, or a WiFi system. In other embodiments, the system 10 may be a wired communication system such as a storage system and a network system. Hereinafter, the system 10 will be described mainly with reference to the wireless communication system as an example.

Transmitter 100 may include a polar code constructor 110, an encoder 130, an interleaver 150, a layer mapper 170, a precoder 190, and first through $p^{th}$ output terminals TX1 through TXp that may respectively output transmitting signals $\{x_1, \ldots, x_p\}$. Receiver 200 may receive q receiving signals $\{y_1, \ldots, y_q\}$ via first through q input terminals RX1 through RXq. When the system 10 is a wireless communication system, each of the first through $p^{th}$ output terminals TX1 through TXp may be a modulator and an antenna (or a single modulator may be used for all the output terminals); and the first through $q^{th}$ input terminals RX1 through RXq may each be a demodulator and an antenna (or a single demodulator may be used for all the input terminals). The transmitter 100 may include p output terminals TX through TXp and the receiver 200 may include q input terminals RX1 through RXq. The MIMO channel 300 may be represented as a channel matrix H including $h_{11}$ through $h_{qp}$ as elements, for a total of (q×p) elements. A smaller number of the number p of the first through $p^{th}$ output terminals TX1 through TXp and the number q of the first through q input terminals RX1 through RXq may be referred to as a rank of the MIMO channel 300. In other words, the rank of the MIMO channel 300 may be defined as r=min (p, q), and the MIMO channel 300 may be said to include r layers.

The polar code constructor 110 may construct the polar code for the MIMO channel 300, where the polar code has a plurality of "bit-channels". For example, the polar code constructor 110 may obtain information about the MIMO channel 300 and may construct the polar code based on such MIMO channel information. As described below with reference to FIG. 2 and subsequent figures, the polar code constructor 110 may divide the MIMO channel 300 into a plurality of single input single output (SISO) channels, and may allocate individual bit-channels of the polar code to respective ones of the plurality of SISO channels. This approach may avoid the need to use a plurality of encoders respectively corresponding to the first through $p^{th}$ output terminals TX1 through TXp or a plurality of decoders respectively corresponding to the first through $q^{th}$ input terminals RX1 through RXq, for the purpose of applying the polar code to the MIMO channel 300. Accordingly, resources, for example, power, hardware resources, etc., which would otherwise be used to apply the polar code to the MIMO channel 300 may be reduced, and the polar code to reduce a bit error rate (BER) may be constructed (virtually) in the MIMO channel 300. The polar code constructor 110 may control the encoder 130 and the interleaver 150 according to the constructed polar code. Details of an example polar code constructor 110 will be described below with reference to FIG. 3 and other figures.

The encoder 130 may generate an N-bit code-word, that is, encoded data D_ENC, by encoding K-bits source data D_SRC using the polar code constructed by the polar code constructor 110. The polar code may be based on channel polarization, which defines bit-channels observed at an input stage as being polarized into good bit-channels and bad bit-channels representing high reliability and low reliability channels, respectively. (Hereafter, bit-channels of the polar code may be interchangeably called sub-channels or just channels of the polar code.) Accordingly, in the polar code, information bits of the source data D_SRC, that is, unfrozen bits, may be allocated to the good bit-channels while frozen bits having known values at both sides of the transmitter 100 and the receiver 200 may be allocated to the bad bit-channels. Accordingly, the K bits among the N bits may be "unfrozen" bits, while remaining bits may be "frozen" bits. A code rate may be defined as R=K/N, where the code rate R may be pre-defined and provided to the polar code constructor 110.

The interleaver 150 may interleave the encoded data D_ENC based on the polar code constructed by the polar code constructor 110 so as to generate interleaved data D_INT including r groups respectively corresponding to the r layers of the MIMO channel 300. As described later with reference to FIG. 6, etc., the polar code constructor 110 may allocate each of the polar code channels to one of the SISO channels based on the states of the SISO channels, and the interleaver 150 may generate the interleaved data D_INT from the encoded data D_ENC according to a result of the allocation of the polar code constructor 110. Accordingly, as illustrated in FIG. 1, the interleaved data D_INT including r groups, each of which has N/r bits, may be generated. An example of the interleaver 150 will be described below with reference to FIG. 7.

The layer mapper 170 may generate mapped data D_MAP to distribute the interleaved data D_INT provided by the interleaver 150 to the first through $p^{th}$ output terminals TX1 through TXp or to a plurality of layers. (As noted earlier, each of the first through $p^{th}$ output terminals TX1 through TXp may be a modulator and an antenna, in which case any output terminal TXi may be considered at least part of a "layer". Alternatively, modulators may be included in the precoder 190 such that any output terminal TXi may be just an antenna.) In some embodiments, the layer mapper 170 may evenly distribute bits of the interleaved data D_INT. The precoder 190 may apply a precoding matrix generated by singular value decomposition (SVD) of the channel matrix H to the mapped data D_MAP provided by the layer mapper 170 so that the transmitting signals $\{x_1, \ldots, x_p\}$ are provided to the first through $p^{th}$ output terminals TX1 through TXp, respectively.

The receiver 200 may perform operations corresponding to the transmitter 100 so as to process the received signals $\{y_1, \ldots, y_q\}$ received via the first through $q^{th}$ input terminals RX1 through RXq. For example, a receiving matrix, which is generated by performing the SVD of the channel matrix H, may be applied to the receiving signals $\{y_1, \ldots, yq\}$ received via the input terminals RX1 to RXq. Next, a layer de-mapper (not shown) of the receiver 200 may perform an inverted operation of the operation performed by the layer mapper 170 of the transmitter 100 and a de-interleaver (not shown) may rearrange the bits of data provided by the layer de-mapper by performing the inverted operation of the operation performed by the interleaver 150 of the transmitter 100. A decoder (not shown) may generate estimated K-bits information bits by decoding the N-bit data provided by the de-interleaver according to the polar code. In some embodiments, the transmitter 100 in FIG. 1 may receive signals from the receiver 200 via the MIMO channel 300, and to this end, the transmitter 100 may include additional components to process the received signals. Example embodiments of the present disclosure will be described mainly with reference to the transmitter 100 below, but it should be noted that the concepts of these embodiments are also similarly applicable to the receiver 200.

Figure 2:
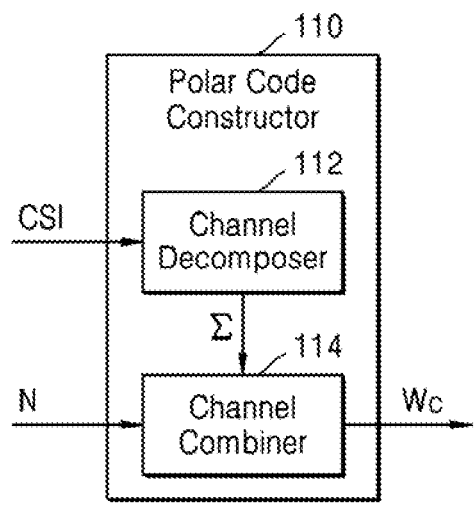
FIG. 2 is a block diagram illustrating an example of a polar code constructor in FIG. 1 according to an embodiment.

FIG. 2 is a block diagram illustrating an example polar code constructor 110 in FIG. 1 according to an embodiment. As described above with reference to FIG. 1, polar code constructor 110 of FIG. 2 may construct the polar code for the MIMO channel 300 in FIG. 1, and may control the encoder 130 and the interleaver 150 according to the constructed polar code. As illustrated in FIG. 2, the polar code constructor 110 may include a channel decomposer 112 and a channel combiner 114.

The channel decomposer 112 may receive channel state information CSI as channel information. The channel state information CSI may be shared by the transmitter 100 and the receiver 200 in various manners. For example, the receiver 200 may estimate a channel state based on signals received from the transmitter 100, generate the channel state information CSI from the estimated channel state, and provide the generated channel state information CSI to the transmitter 100. In some embodiments, the transmitter 100 and the receiver 200 may share at least one index, where the index may indicate one of a plurality of items included in a table shared by the transmitter 100 and the receiver 200.

The channel decomposer 112 may generate a plurality of mutually independent SISO channels from the MIMO channel 300 based on the channel state information CSI.

In FIG. 1, the channel matrix H may be a q×p matrix and represented as Formula 1 below through the SVD of the channel matrix H.

$$H = U\Sigma V^H \qquad \text{[Formula 1]}$$

In Formula 1, V and U may form an orthonormal set, V may be referred to as the precoding matrix, and $U^H$ may be referred to as a receiving matrix. Σ may be a diagonal matrix having eigenvalues, that is, $\{\lambda_1, \ldots, \lambda_g\}$ of the channel matrix H, as diagonal elements. As described above with reference to FIG. 1, when the precoding matrix V is applied to the transmitter 100 and the receiving matrix $U^H$ is applied to the receiver 200, the MIMO channel 300 may be represented by a new channel matrix Σ. Since the new channel matrix Σ is a diagonal matrix, there may be no interference between receiving signals $\{y_1, \ldots, y_q\}$ in the receiver 200. Accordingly, the MIMO channel 300 may be decomposed into r SISO channels $\{W_1, \ldots, W_r\}$. The receiving signals $\{y_1, \ldots, y_q\}$ may have quality according to the eigenvalues $\{\lambda_1, \ldots, \lambda_r\}$ of the new channel matrix Σ. In other words, signal to noise ratios (SNRs) of the respective SISO channels may be proportional to the eigenvalues $\{\lambda_1, \ldots, \lambda_r\}$. Since the eigenvalues $\{\lambda_1, \ldots, \lambda_r\}$ are sorted in descending order in the new channel matrix Σ, that is, $(\lambda_1 \geq \lambda_2 \geq \ldots \geq \lambda_r)$, the r SISO channels $(W_1, \ldots, W_r)$ may respectively have the qualities (e.g., the SNRs) in descending order $(SNR_1 \geq SNR_2 \geq \ldots \geq SNR_r)$. As described later, information about the quality of each SISO channel may be used to construct the polar code.

The channel combiner 114 may receive the new channel matrix Σ from the channel decomposer 112 and may receive the bit number N of the codeword representing a magnitude of the polar code. The channel combiner 114 may generate an N×N polar transformation matrix from the bit number N of the codeword. The channel combiner 114 may generate a combined channel $W_C$ by combining r SISO channels $\{W_1, \ldots, W_r\}$ which are represented by the new channel matrix Σ provided from the channel decomposer 112. The combined channel $W_C$ may have indices of unfrozen bits and frozen bits.

In some embodiments, the channel combiner 114 may estimate the qualities of combined channels. For example, the channel combiner 114 may use the Bhattacharyya parameter as a value indicating the quality of the SISO channels $\{W_1, \ldots, W_r\}$. In a binary input memoryless symmetric (BMS) channel, in which X and Y indicate an input data set and an output data set, respectively, having a bit transition probability W (y|x), the Bhattacharyya parameter Z(W) may be defined as Formula 2 below.

$$Z(W) = \Sigma_y \sqrt{W(y|0)W(y|1)} \, (x \in X, y \in Y) \qquad \text{[Formula 2]}$$

In other words, the Bhattacharyya parameter may indicate a maximum probability of a bit error occurring in the BMS channel. The Bhattacharyya parameter in an additive white Gaussian noise (AWGN) channel may be expressed as Formula 3 below when the SNR of the channel is $C_{SNR}$.

$$Z(W) = \exp(-C_{SNR}) \qquad \text{[Formula 3]}$$

In other words, the Bhattacharyya parameter Z(W) may have a lower value as the quality of the channel is higher (i.e., as the SNR is higher).

When a length N of the codeword is $2^n$, that is, $N = 2^n$, there may be n stages of polarization at a time of channel combination. With $j \in \{0, 1, \ldots, n-1\}$ representing the stages of polarization and $Z_j^{(i)}$ representing the Bhattacharyya parameter of an $i^{th}$ channel in a $j^{th}$ stage, it may be possible that $Z_0^{(i)} = Z(W)$, and the Bhattacharyya parameter may be represented as Formula 4 below.

$$Z_{j+1}^i = \begin{cases} 2Z_j^{(i)} - (Z_j^{(i)})^2, & 1 \leq i < 2^j + 1 \\ \left(Z_j^{(i-2^j)}\right)^2, & 2^j + 1 \leq i \leq 2^{j+1} \end{cases} \qquad \text{[Formula 4]}$$

An example of an operation of the channel combiner 114 will be described below with reference to FIGS. 3, 4, and 5.

Figure 3:
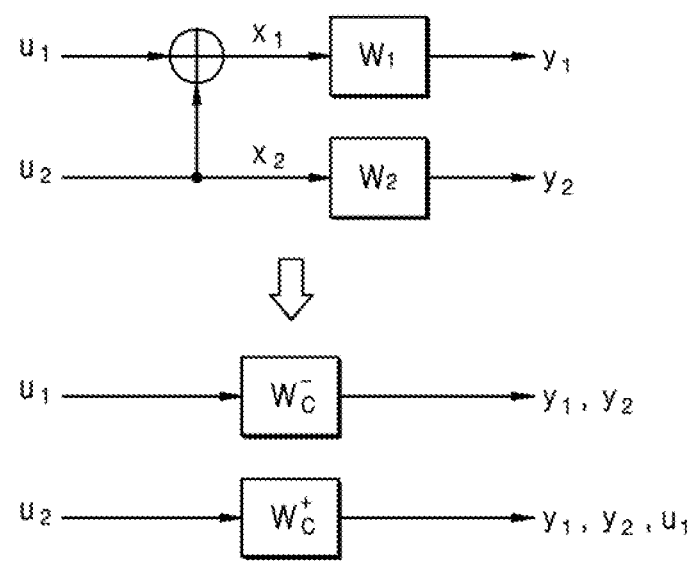
FIG. 3 is a diagram illustrating a basic block of polar transformation according to an embodiment.

FIG. 3 is a diagram illustrating a basic block of polar transformation according to an embodiment. As shown in FIG. 3, the basic block for polar transformation may be related to two BMS channels $\{W_1, W_2\}$, and the two BMS channels $\{W_1, W_2\}$ may be transformed into binary input channels $\{W_C^-, W_C^+\}$ by applying the Arikan polarization kernel F in Formula 5 below.

$$F = \begin{bmatrix} 1 & 0 \\ 1 & 1 \end{bmatrix} \qquad \text{[Formula 5]}$$

In the polar transformation in FIG. 3, the Bhattacharyya parameter may be calculated as described in Formula 6 below.

$$Z(W_C^-) \leq Z(W_1) + Z(W_2) - Z(W_1)Z(W_2)$$

$$Z(W_C^+) = Z(W_1)Z(W_2)$$

$$Z(W_C^+) \leq Z(W_C^-) \qquad \text{[Formula 6]}$$

As explained further hereafter, the channels of the polar code may be respectively allocated to the SISO channels, and when the channels are combined, the Bhattacharyya parameters calculated from the Bhattacharyya parameters of the SISO channels may be used in the process of combining the channels.

In some embodiments, the r SISO channels may be grouped into r/2 pairs of SISO channels, and a combined channel W' may be generated by combining the grouped SISO channels according to the polar transformation. Accordingly, the channel W' may represent channels combined from the r SISO channels at $\log_2 r$ stages. Then, in the same manner that the SISO channels have been combined, identical copies of the channel W' may be combined at $\log_2 N - \log_2 r$ stages. For example, when N is a multiple of r, $2^{(n-\log_2 r)}$ copies of the channel W' may be combined. Examples of channel combination will be described below.

Figure 4:
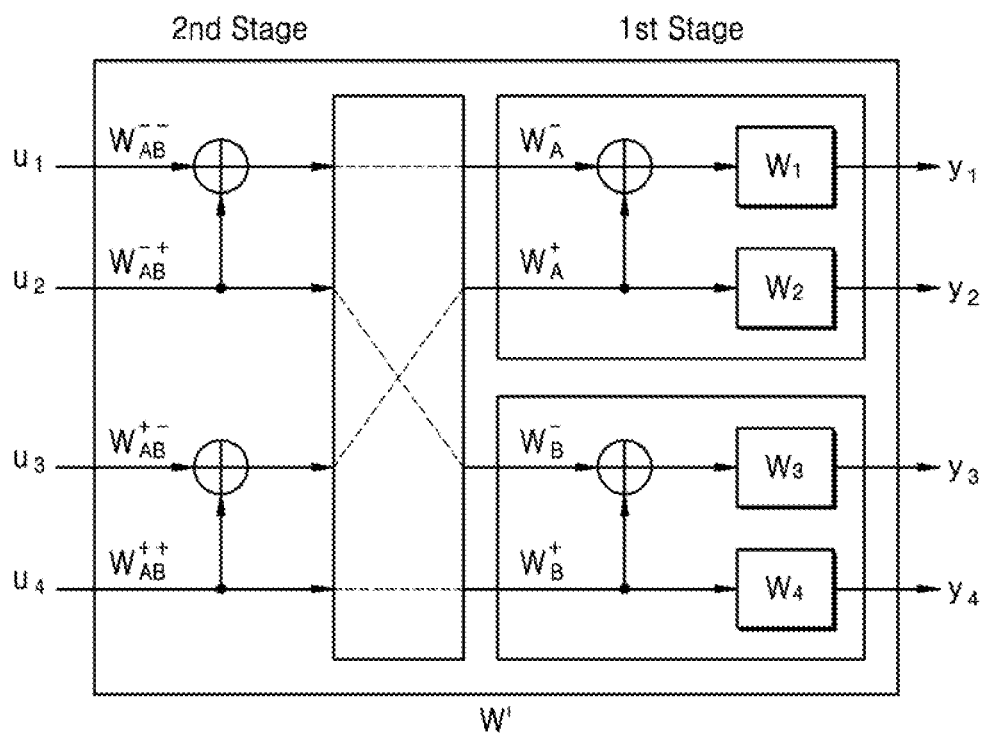
FIG. 4 is a diagram illustrating an example of polar transformation according to an embodiment.

FIG. 4 is a diagram illustrating an example of polar transformation according to an embodiment of the present disclosure. FIG. 4 illustrates an example of constructing a polar code of 4 bits in a 4×4 MIMO channel (that is, in this case, N=4 and n=2).

The MIMO channel may be decomposed into, for example, four mutually independent SISO channels $\{W_1, W_2, W_3, W_4\}$ by the channel decomposer 112 in FIG. 2. Accordingly, the polar transformation by Formula 6 may be performed at two stages ($\log_2 4=2$). As illustrated in FIG. 4, at a first stage, two pairs of the SISO channels $\{W_1, W_2\}$ and $\{W_3, W_4\}$ may be transformed into two pairs of combined channels $\{W_A^-, W_A^+\}$ and $\{W_B^-, W_B^+\}$. At a second stage, two pairs of channels $\{W_A^-, W_A^+\}$ and $\{W_B^-, W_B^+\}$ may be transformed into two pairs of combined channels $\{W_{AB}^{--}, W_{AB}^{-+}\}$ and $\{W_{AB}^{+-}, W_{AB}^{++}\}$. Finally, a combined channel W' in which $W'=\{W_{AB}^{--}, W_{AB}^{-+}, W_{AB}^{+-}, W_{AB}^{++}\}$ may be generated. As described above with reference to FIG. 3, $2^{n-2}$ identical copies of the channel W' may be combined at (n−2) stages. When the polar transformation is completed at n stages, indices corresponding to the K lowest Bhattacharyya parameters may be allocated to the unfrozen bits, while the remaining (N−K) indices may be allocated to the frozen bits.

Figure 5:
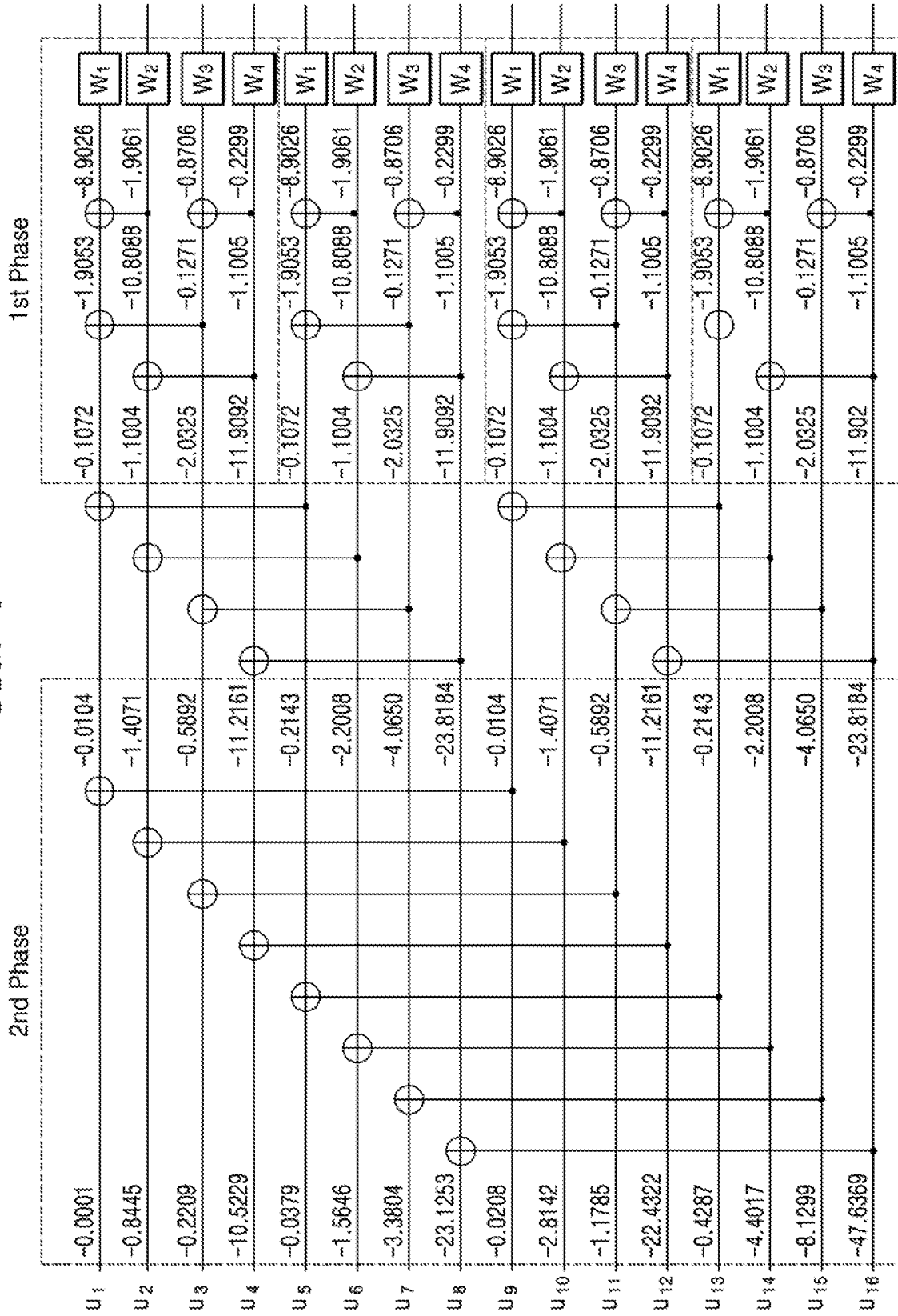
FIG. 5 is a diagram illustrating an example of polar transformation according to an embodiment.

FIG. 5 is a diagram illustrating an example of polar transformation according to an embodiment of the present disclosure. This example illustrates constructing the polar code when the number of bits of the codeword is 16 in a 4×4 MIMO channel (that is, r=4, N=16, and n=4). In addition, FIG. 5 illustrates the Bhattacharyya parameters calculated at each stage in a logarithmic domain, when the SISO channels are sorted in descending orders of the channel quality, and have SNRs of 12.5 dB, 5.8 dB, 2.4 dB, and −3.37 dB, respectively (where a negative SNR signifies more noise power than signal power).

The calculation for the Bhattacharyya parameters may be propagated from the right side to the left side in FIG. 5. As illustrated, in the first phase, the Bhattacharyya parameters may be calculated by composing four SISO channels $\{W_1, W_2, W_3, W_4\}$. Next, in the second phase, the Bhattacharyya parameters may be calculated from four copies of the channel combined in the first phase. Accordingly, the Bhattacharyya parameters may be calculated for sixteen channels corresponding to the input bits $\{u_1, u_2, \ldots, u_{16}\}$ of the polar code.

The unfrozen bits and the frozen bits of the polar code may be arranged based on the Bhattacharyya parameters. In other words, each frozen bit may be allocated to a channel corresponding to a Bhattacharyya parameter having a relatively higher value, and each unfrozen bit may be allocated to a channel corresponding to a Bhattacharyya parameter having a relatively lower value. For example, when a code rate is about 0.5, in other words, when unfrozen bits of eight bits and frozen bits of eight bits are arranged, the eight frozen bits may be allocated to bits $\{u_1, u_2, u_3, u_4, u_5, u_9, u_{10}, u_{11}\}$ corresponding to eight Bhattacharyya parameters having the greatest values. Accordingly, the frozen bits may have indices $\{1,2,3,4,5,9,10,11\}$. In addition, the unfrozen bits (or information bits) of 8 bits may be allocated to bits $\{u_6, u_7, u_8, u_{12}, u_{13}, u_{14}, u_{15}, u_{16}\}$ corresponding to eight Bhattacharyya parameters having the smallest values. Thus, the unfrozen bits may have indices $\{6,7,8,12,13,14,15,16\}$. In other words, in FIG. 1, the bits of the K-bits source data D_SRC may be allocated to the bits corresponding to K Bhattacharyya parameters having the lowest values among the N bits, and the polar code constructor 110 may provide to the encoder 130 indices to which bits of the source data D_SRC are allocated.

Figure 6:
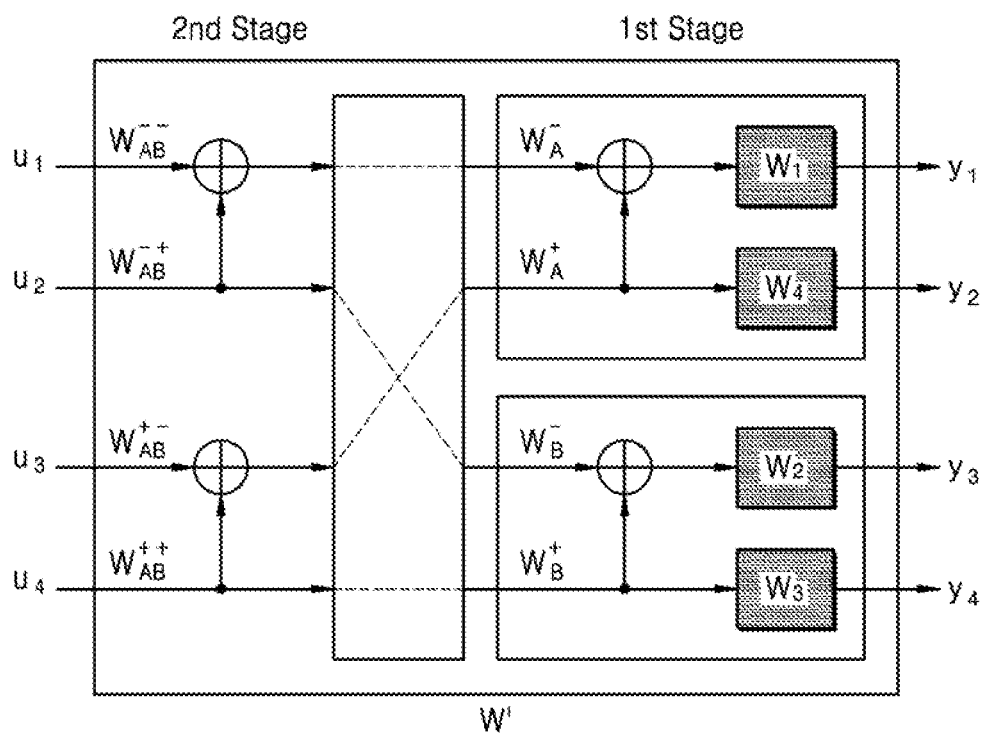
FIG. 6 is a diagram illustrating an example of polar transformation according to an embodiment.

FIG. 6 is a diagram illustrating an example of polar transformation according to an embodiment of the present disclosure. The example illustrates a polar code of 4 bits in a 4×4 MIMO channel (that is, N=4 and n=2) and unlike the example in FIG. 4, a channel combined from two pairs of channels $\{W_1, W_4\}$ and $\{W_2, W_3\}$ of the SISO channels $\{W_1, W_2, W_3, W_4\}$ may be generated.

As described above with reference to FIG. 5, in the process of composing channels according to the polar transformation, the Bhattacharyya parameter may depend on channels to be combined. For example, in the first phase in FIG. 5, different values for the Bhattacharyya parameters may result according to a combination of the SISO channels $\{W_1, W_2, W_3, W_4\}$. In other words, the Bhattacharyya parameters may be determined to differ depending on a result of a grouping of the SISO channels $\{W_1, W_2, W_3, W_4\}$ into two pairs, that is, a division of the SISO channels $\{W_1, W_2, W_3, W_4\}$.

It may be possible to obtain r/2 pairs from r SISO channels $\{W_1, W_2, \ldots, W_r\}$. With a parameter L defined as a set having all possible combinations of pairs of the SISO channels as elements, the number of elements of L may be calculated as in Formula 7 below.

$$|L| = \frac{r!}{2^{\frac{r}{2}} \times \left(\frac{r}{2}\right)!} \qquad \text{[Formula 7]}$$

For example, when the 4×4 MIMO channel is decomposed into four SISO channels $\{W_1, W_2, W_3, W_4\}$, L may have three elements as shown in Formula 8 below.

$$L=\{\{(W_1,W_2),(W_3,W_4)\},\{(W_1,W_3),(W_2,W_4)\},\{(W_1,W_4),(W_2,W_3)\}\} \qquad \text{[Formula 8]}$$

Similarly, in an 8×8 MIMO channel, it may be possible that |L|=105, and in a 16×16 MIMO channel, it may be possible that |L|=2027025. A parameter $\pi_{opt}$, which represents an optimum pairing of the SISO channels as elements of L, may minimize an upper limit of a block error rate $P_{b_r}$ for a block having a size of r. $\pi_{opt}$ is represented as Formula 9 below.

$$\pi_{opt} = \arg \min_{x \in L} P_{b_r} \qquad \text{[Formula 9]}$$

Determining an optimum pairing for the SISO channels by calculating the Bhattacharyya parameters in all cases based on Formula 9 may be challenging when a change in the MIMO channel and real time communication are considered. This issue may be resolved deterministically as Formula 10 below.

$$\pi_{opt} = \left\{(W_1, W_r), (W_2, W_{r-1}), \ldots, \left(W_{\frac{r}{2}}, W_{\frac{r}{2}+1}\right)\right\} \qquad \text{[Formula 10]}$$

According to Formula 10, in the first stage of the polar code, a SISO channel of the highest quality may be paired with a SISO channel of the lowest quality, and a SISO channel of the second highest quality may be paired with a SISO channel of the second lowest quality. In other words, the r SISO channels may be grouped into r/2 pairs such that a sum of the indices of each pair is (r+1). For example, an optimum pairing of four SISO channels $\{W_1,W_2,W_3,W_4\}$ sorted in descending order may be represented as Formula 11 below.

$$\pi_{opt}=\{(W_1,W_4),(W_2,W_3)\} \quad \text{[Formula 1]}$$

Accordingly, as illustrated in FIG. 6, in the first stage, two pairs $\{W_1,W_4\}$ and $\{W_2,W_3\}$ of the SISO channels may be transformed into two pairs of combined channels $\{W_A^-, W_A^+\}$ and $\{W_B^-,W_B^+\}$. In the second stage, two pairs $\{W_A^-,W_A^+\}$ and $\{W_B^-,W_B^+\}$ of the SISO channels may be transformed into two pairs of combined channels $\{W_{AB}^{--}, W_{AB}^{-+}\}$ and $\{W_{AB}^{+-},W_{AB}^{++}\}$. Finally, the combined channel $W'=\{W_{AB}^{--},W_{AB}^{-+},W_{AB}^{+-},W_{AB}^{++}\}$ may be generated.

Figure 7:
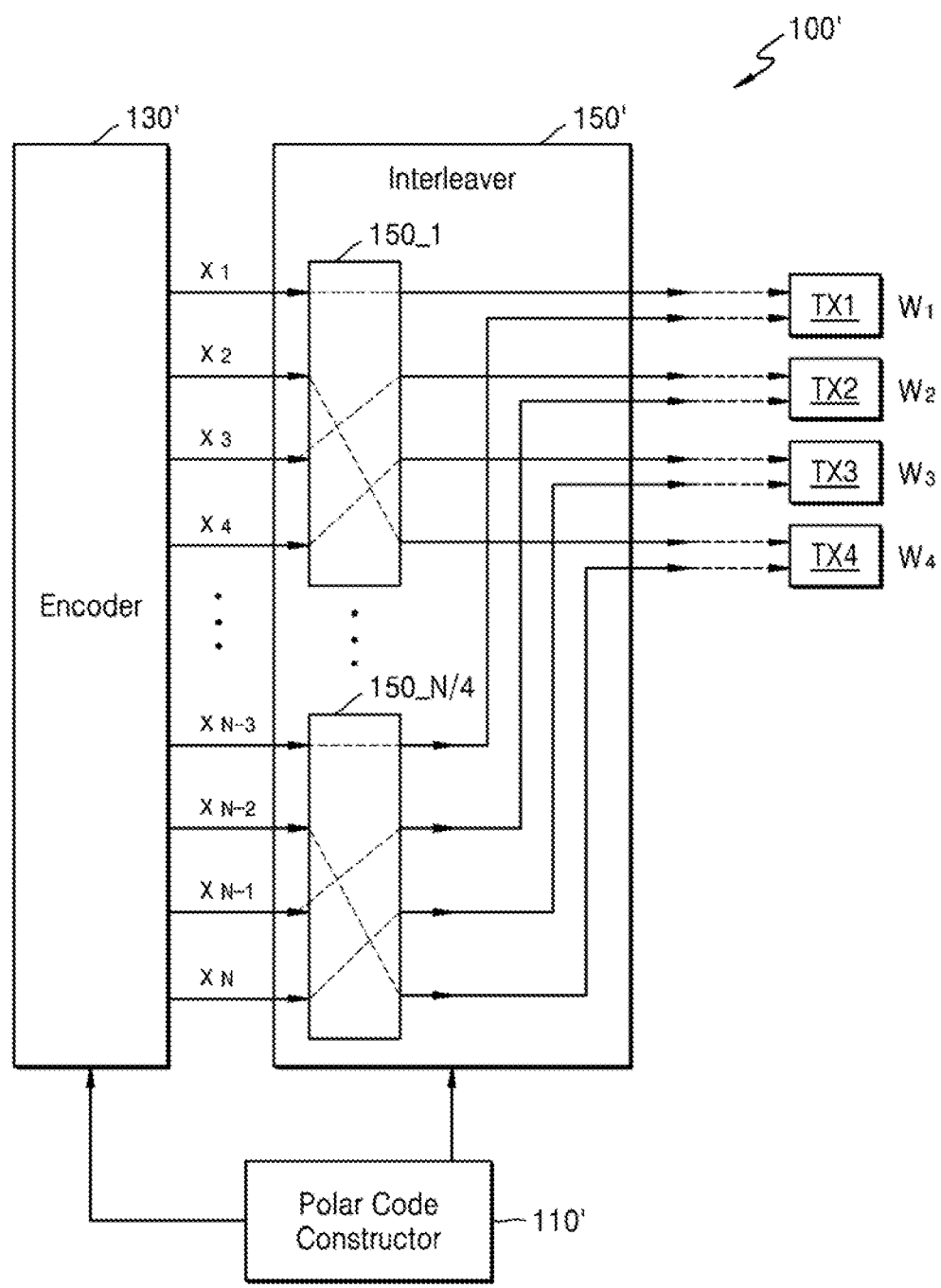
FIG. 7 is a block diagram illustrating an example of a transmitter in FIG. 1 according to an embodiment.

FIG. 7 is a block diagram illustrating a transmitter, 100', which is an example of the transmitter 100 in FIG. 1 according to an embodiment. Transmitter 100 includes four output terminals TX1 through TX4, polar code constructor 110', an encoder 130', and an interleaver 150' that operates based on Formula 10, as well as other components of transmitter 100 in FIG. 1 (e.g., layer mapper 170, precoder 190, not shown in FIG. 7). As described above with reference to FIG. 1, the interleaver 150' in FIG. 7 may generate interleaved data including four groups by interleaving encoded data $\{x_1, x_2, \ldots, x_N\}$ received from the encoder 130'.

As described above with reference to FIG. 6, the SISO channels may be grouped into a plurality of pairs based on Formula 10, and the polar transformation may be applied as a function of the pairs of the grouped SISO channels. The interleaver 150' may be configured such that the channel of the polar code corresponds to the SISO channel according to Formula 10. For instance, as illustrated in FIG. 7, the interleaver 150' may include N/4 (or first through (N/4)$^{th}$) switch blocks 150_1 through 150_N/4, and each of the first through (N/4) switch blocks 150_1 through 150_N/4 may receive data of 4 bits among encoded data. Each of the first through (N/4)$^{th}$ switch blocks 150_1 through 150_N/4 may route bits of the received data to one of the four layers, under the control of the polar code constructor 110'. For example, the first switch block 150_1 may receive $\{x_1,x_2,x_3,x_4\}$, and may be configured as illustrated in FIG. 6 such that $\{x_1,x_2, x_3,x_4\}$ and $\{W_1,W_2,W_3,W_4\}$ are interrelated as per Formula 11.

Figure 8:
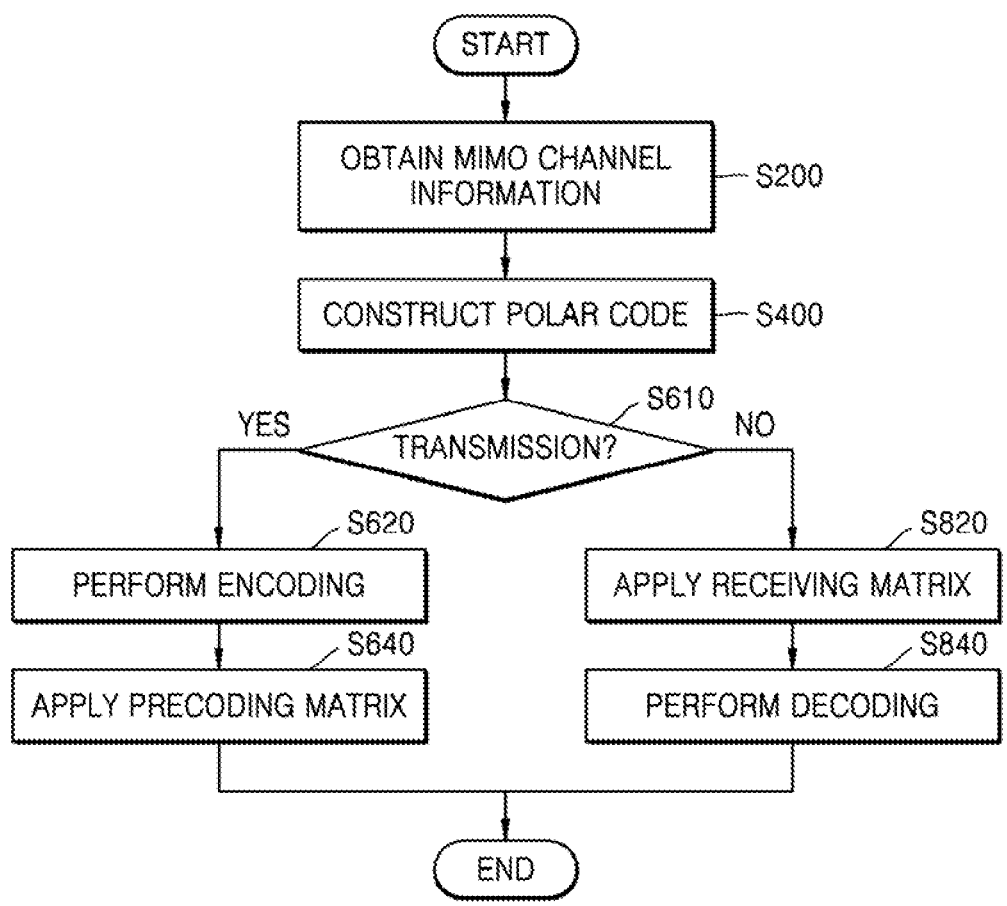
FIG. 8 is a flowchart of a communication method according to an embodiment.

FIG. 8 is a flowchart of a communication method according to an embodiment. In particular, the communication method of FIG. 8 may include operation S400 of constructing the polar code for the MIMO channel according to an embodiment. For example, operations in FIG. 8 may be performed by the transmitter 100 and/or the receiver 200 in FIG. 1; thus the method of FIG. 8 will be described with reference to FIG. 1.

MIMO channel information may be obtained (S200). For example, the receiver 200 in FIG. 1 may estimate a state of the MIMO channel based on a signal received from the transmitter 100. Transmitter 100 may also receive from the receiver 200 information about the state of the MIMO channel 300 estimated by the receiver 200. Accordingly, the transmitter 100 and the receiver 200 may share the MIMO channel information. Note that the manner of acquiring the MIMO channel information is not limited to the above-mentioned examples.

The polar code for the MIMO channel may be constructed (S400). For example, the MIMO channel may be decomposed into the plurality of mutually independent SISO channels, and each of the channels of the polar code may be allocated to one of the plurality of SISO channels. (Examples of operation S400 will be described later with reference to FIGS. 9 and 10.)

When data to be transmitted (Yes output of S610) is processed by using the polar code generated in operation S400, encoding operation S620 may be performed subsequently. The encoding may involve receiving indices for the unfrozen bits and the frozen bits provided by the polar code generated in operation S400. The bits of data to be transmitted may be arranged in the unfrozen bits, and the bits of predetermined fixed value may be arranged in the frozen bits. Encoded data may be generated by applying the polar code to the unfrozen bits and the frozen bits. Next, the precoding matrix may be applied (S640). For example, the precoding matrix may be obtained by performing the SVD on the channel matrix extracted from the MIMO channel information obtained in operation S200, and the precoding matrix may be applied to the encoded data.

When the received data is processed by using the polar code constructed in operation S400 (NO output of S610), operation S820 of applying a receiving matrix may be performed subsequently. For example, the receiving matrix may be obtained by performing the SVD on the channel matrix extracted from the MIMO channel information obtained in operation S200. The receiving matrix may be applied to data received via the MIMO channel. Next, decoding may be performed (S840). The frozen bits and the unfrozen bits of the decoded data based on the indices for the unfrozen bits and the frozen bits provided from the polar code constructed in operation S400 may be distinguished.

Figure 9:
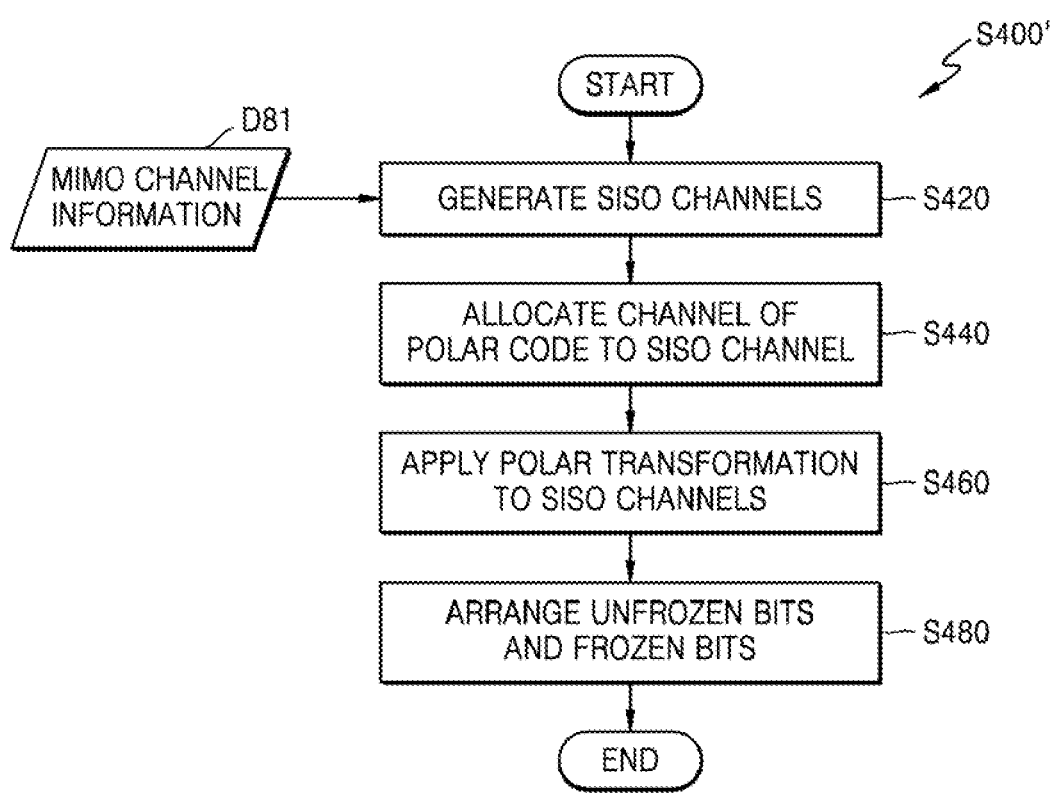
FIG. 9 is a flowchart of an example operation S400 in FIG. 8 according to an embodiment.

FIG. 9 is a flowchart depicting an example of operation S400 in FIG. 8 according to an embodiment. As described above with reference to FIG. 8, constructing the polar code for the MIMO channel may be performed in operation S400' of FIG. 9. As illustrated in FIG. 9, operation S400' may include a plurality of operations S420, S440, S460, and S480. For instance, operation S400' may be performed by the polar code constructor 110 example of FIG. 2.

The SISO channels may be generated (S420). For example, r SISO channels may be generated by performing the SVD on the channel matrix extracted from the MIMO channel information D81. An example of operation S420 will be described below with reference to FIG. 10.

The channel of the polar code may be allocated to the SISO channel (S440). For example, when the length of the codeword is N, each of N channels of the polar code may be allocated to one of the r SISO channels generated in operation S420. Accordingly, as illustrated in the case that r=4 in the first phase in FIG. 5, positions of r SISO channels may be determined, and the positions of r SISO channels may be repeated. In addition, as described above with reference to FIG. 6, r SISO channels may be paired to reduce the bit error rate.

The polar transformation may be applied to the SISO channels (S460). For example, as described above with reference to FIG. 5, a channel combined from r SISO channels may be generated and copies of the combined channels may be subsequently combined. In a combining process of the channels, the qualities of the combined channels may be estimated. An example of operation S460 will be described below with reference to FIG. 10.

The unfrozen bits and the frozen bits may be arranged (S480). For example, the unfrozen bits and the frozen bits may be arranged according to the quality and the code rate of the channels corresponding to each of the bits. Accordingly, the unfrozen bits and the frozen bits may be allocated to the good channels and the bad channels, respectively. An example of operation S480 will be described below with reference to FIG. 11.

Figure 10:
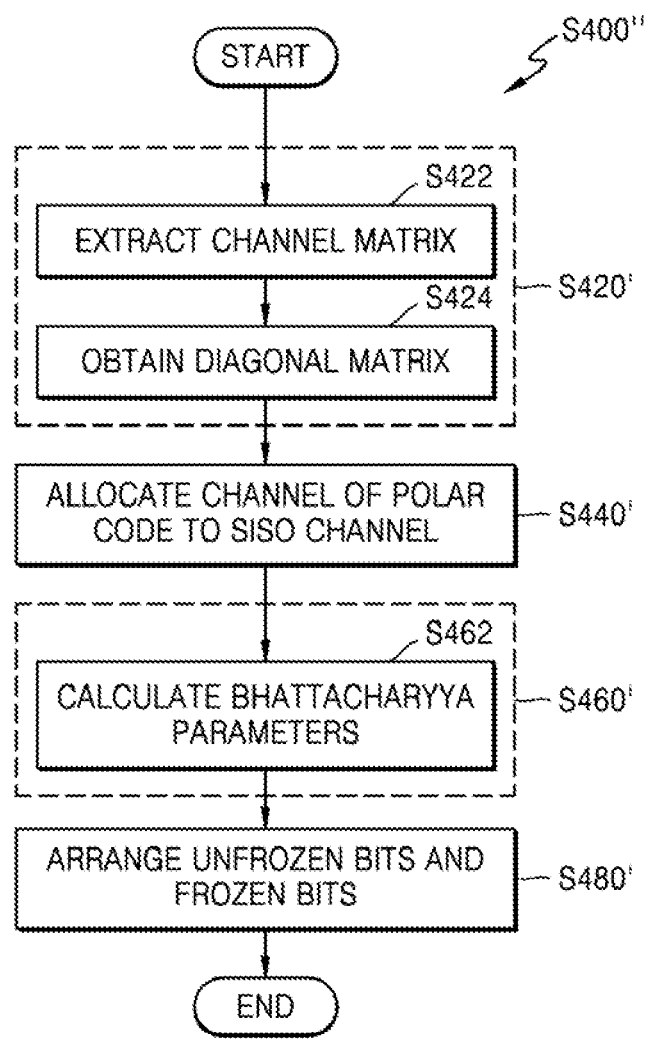
FIG. 10 is a flowchart of an example operation S400 in FIG. 8 according to an embodiment.

FIG. 10 is a flowchart of an example operation 8400 in FIG. 8 according to an embodiment. Specifically, operation S400" of FIG. 10 may be an example of operations S420 and S460 of FIG. 9 and may include operations S420' and S460'. The descriptions with respect to FIG. 10 overlapping those with respect to FIG. 9 are omitted for brevity.

The SISO channels may be generated (S420'), where operation S420' may include operations S422 and S424. The channel matrix may be extracted in operation S422 and the diagonal matrix may be obtained in operation S424. When the rank of the MIMO channel is r, the channel matrix may be an r×r matrix and the diagonal matrix may be obtained by performing the SVD on the channel matrix. Accordingly, r SISO channels may be obtained. The channel of the polar code may be allocated to the SISO channel (S440').

The polar transformation may be applied to the SISO channels (S460'). As illustrated in FIG. 10, operation S460' may include operation S462 in which the Bhattacharyya parameter may be calculated. As described above with reference to Formula 2, etc., the Bhattacharyya parameter may have a value indicating the quality of the SISO channel as a maximum probability of occurrence of the bit error. As illustrated in FIG. 5, in a process of the polar transformation, the Bhattacharyya parameters of the combined channels may be calculated and finally, the Bhattacharyya parameters corresponding to each of the input bits of the polar code may be calculated. Lastly, the unfrozen bits and the frozen bits may be arranged (S480').

Figure 11:
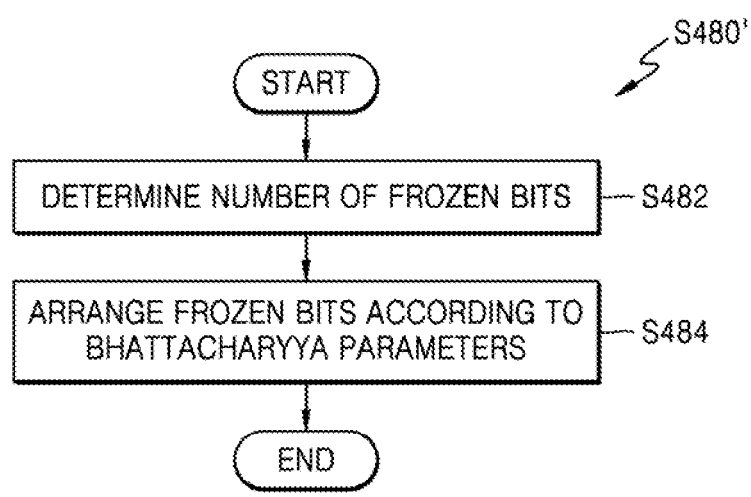
FIG. 11 is a flowchart of an example operation S480 in FIG. 9 according to an embodiment.

FIG. 11 is a flowchart of an example operation, S480', which is an example of operation S480 in FIG. 9 according to an embodiment. As described above with reference to FIG. 9, the operation of arranging the unfrozen bits and the frozen bits may be performed in operation S480. As illustrated in FIG. 11, operation S480' may include operations S482 and S484.

The number of frozen bits may be determined (S482). For example, at least two of the number N of bits, the code rate R, and the number K of information bits of the code word of the polar code may be obtained. Accordingly, the number of frozen bits (that is, N−K) and the number of unfrozen bits (that is, K) may be determined.

The frozen bits may be arranged depending on the Bhattacharyya parameters (S484). Bhattacharyya parameters of the channels combined in the polar transformation process may be calculated so that the frozen bits are allocated to the channels of low quality, that is, of the highest value Bhattacharyya parameters. Accordingly, the unfrozen bits, that is, information bits, may be allocated to the channels of high quality, that is, of the lowest value Bhattacharyya parameters.

Figure 12A:
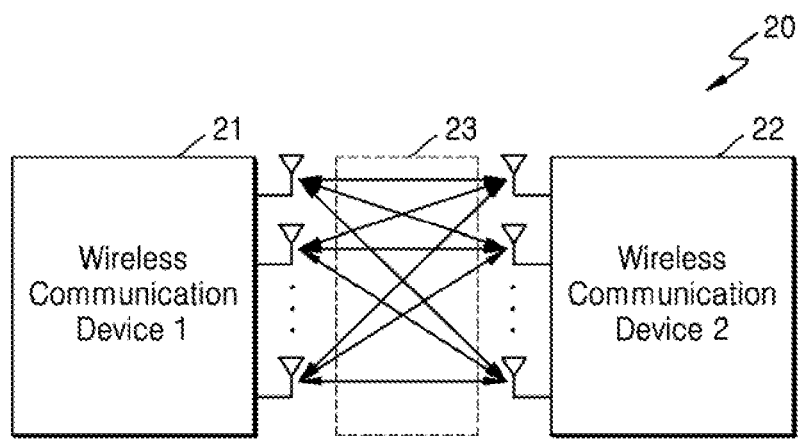
FIGS. 12A, 12B, and 12C are respective block diagrams illustrating respective examples of systems according to embodiments.
Figure 12B:
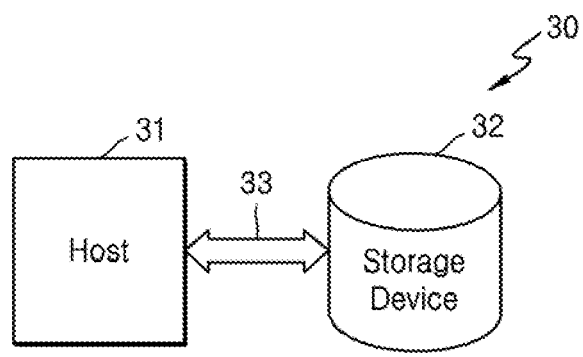
Figure 12C:
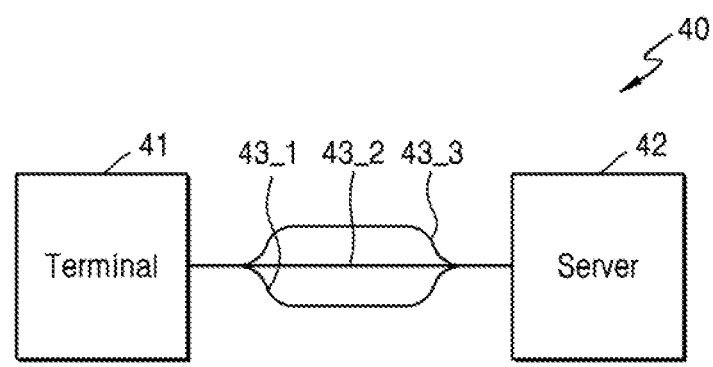

FIGS. 12A, 12B, and 12C are block diagrams illustrating respective examples of systems, 20, 30, and 40, according to embodiments. The two entities included in each of the systems 20, 30, and 40 of FIGS. 12A, 12B, and 12C may communicate unidirectionally and/or bi-directionally via the MIMO channel, and the polar code may be constructed and used for communication according to example embodiments of the present disclosure described above.

Referring to FIG. 12A, the system 20 may be a wireless communication system. A first wireless communication device 21 and a second wireless communication device 22 may respectively include a plurality of antennas, and may communicate with each other by using a polar code for a MIMO channel 23. For example, the first wireless communication device 21 may be a base station which is a fixed station communicating with user equipment and/or another base station. Examples of the first wireless communication device 21 may include a Node B, an evolved Node B (eNB), a sector, a site, a base transceiver system (BTS), an access point (AP), a relay node, a remote radio head (RRH), a radio unit (RU), a small cell, etc. In addition, the second wireless communication device 22 may be fixed or mobile as user equipment, and may communicate with the base station to transmit and receive data and/or control information. Examples of the second wireless communication device 22 may include terminal equipment, a mobile station (MS), a mobile terminal (MT), a user terminal (UT), a subscriber station (SS), a handheld device, and so forth.

Referring to FIG. 12B, the system 30 may be a storage system and may include a host 31, a storage device 32, and an interface 33. The host 31 may be a processor or a computing system including the processor as a non-limiting example and may transmit a request of write, read, erase, etc., to the storage device 32 via the interface 33. The storage device 32 may include a semiconductor memory device, as a non-limiting example, such as a flash memory, a solid state drive (SSD), and a memory card, and may include a storage medium different from the semiconductor memory device such as a hard disk drive (HDD) and an optical disc. The storage device 32 may perform an operation corresponding to the request of the host 31 and may provide a response to the host 31 via the interface 33.

The interface 33 may be modelled as the MIMO channel. For example, a number of requests to write and read data may be transmitted in parallel via the interface 33, and due to multiple requests having such directional nature, the interface 33 may be modelled as the MIMO channel and the polar code constructed according to embodiments may be used.

Referring to FIG. 12C, the system 40 may be a network system, and may include a terminal 41 and a server 42. The polar code construction method according to the example embodiments may be applied to an application layer forward error correction (AL-FEC). For example, the system 40 may operate in accordance with a multi-path transmission control protocol (TCP) (MPTCP) as a multi-path transport protocol, and the terminal 41 and the server 42 may simultaneously transmit and receive data through a plurality of TCP paths 43_1, 43_2, and 43_3, where the plurality of TCP paths 43_1, 43_2, and 43_4 may be modelled as the MIMO channel. The AL-FEC may be modelled as an erasure channel when performance of polar code construction is optimized.

The method of constructing the polar code according to embodiments, as well as the examples illustrated in FIGS. 12A, 12B, and 12C, may be used to improve performance of the bit-interleaved coded modulation (BICM) method. The BICM method may provide unequal error protection (UEP) to the bits mapped to modulation symbols and thus, may be regarded as a virtual MIMO channel.

Apparatus and methods of constructing and using a polar code according to the above-described embodiments may avoid using a plurality of encoders respectively corresponding to the first through $p^{th}$ output terminals TX1 through TXp or a plurality of decoders respectively corresponding to the first through $q^{th}$ input terminals RX1 through RXq, for the purpose of applying the polar code to the MIMO channel 300 on the transmit side, and decoding the polar code on the receive side. Accordingly, hardware and processing resources that would otherwise be used to apply the polar code to the MIMO channel 300, and accurately receive data transmitted through the MIMO channel 300, may be reduced, and less power may be consumed in the overall process as compared to conventional art.

Figure 13:
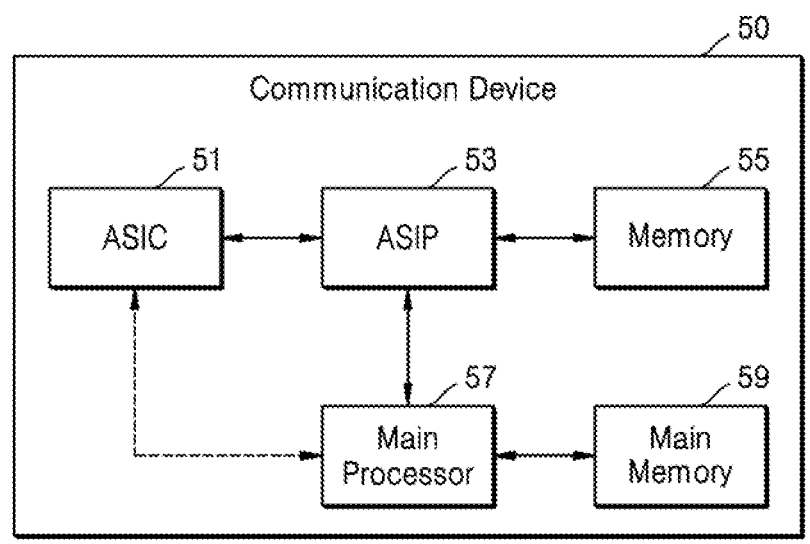
FIG. 13 is a block diagram of a communication device according to embodiments.

FIG. 13 is a block diagram of a communication device 50 according to embodiments. As illustrated in FIG. 13, the communication device 50 may include an application specific integrated circuit (ASIC) 51, an application specific instruction set processor (ASIP) 53, a memory 55, a main processor 57, and a main memory 59. Two or more of the ASIC 51, the ASIP 53, and the main processor 57 may communicate with each other. In addition, at least two of the ASIC 51, the ASIP 53, the memory 55, the main processor 57, and the main memory 59 may be embedded in one chip.

The ASIP 53 may be an integrated circuit (IC) customized for a particular application, support a dedicated instruction set for particular applications, and execute instructions included in the instruction set. The memory 55 may communicate with the ASIP 53 and may store, as non-volatile storage, a plurality of instructions to be executed by the ASIP 53. For example, the memory 55 may include, as a non-limiting example, any type of memory accessible by the ASIP 53 such as random access memory (RAM), read only memory (ROM), a tape, a magnetic disk, an optical disc, a volatile memory, and a combination thereof.

The main processor 57 may control the communication device 50 by executing a plurality of instructions. For example, the main processor 57 may control the ASIC 51 and the ASIP 53, and process data received via the MIMO channel, or process user input to the communication device 50. The main memory 59 may communicate with the main processor 57 and may store a plurality of instructions executed by the main processor 57 as a non-transitory storage device. For example, the main memory 59 may include, as a non-limiting example, any type of memory accessible by the ASIP 53 such as RAM, ROM, a tape, a magnetic disk, an optical disc, a volatile memory, and a combination thereof.

The method(s) of constructing the polar code according to the embodiment(s) described above may be performed by at least one or substantially all of the components included in the communication device 50 of FIG. 13. In some embodiments, at least one or substantially all of the operations of the above-described method of constructing the polar code may be implemented as a plurality of instructions stored in the memory 55. In some embodiments, the ASIP 53 may perform at least one or substantially all of the operations of the method of constructing the polar code by executing a plurality of instructions stored in the memory 55. In some embodiments, at least one or substantially all of the operations of the method of constructing the polar code may be implemented in a hardware block designed through logic synthesis or the like and be included in the ASIC 51. In some embodiments, at least one or substantially all of the operations of the method of constructing polar code may be implemented as a plurality of instructions stored in the main memory 59 and may be performed by the main processor 57 by executing the plurality of instructions stored in the main memory 59.

Any one of the above-described components for manipulating, generating and/or processing data and signals, such as any of the above-described encoder, precoder, polar code constructor, interleaver, layer mapper, precoder, channel decomposer, and channel combiner, may be composed of electronic circuitry such as a special purpose hardware circuit or processor or a general purpose processor that executes instructions read from a memory to run a routine to carry out the element's function. Various ones of the above described components may be embodied as part of the same processor, which executes instructions at different stages to carry out the functions of the components sequentially, or using parallel processing. With the use of parallel processing, various ones of the components may be embodied as respective processing elements of a parallel processor. Alternatively, the various components may be embodied as part of a plurality of different processors. For example, with such a composition based on hardware circuitry, the above-discussed encoder, polar code constructor, interleaver, layer mapper, precoder, channel decomposer, and channel combiner may alternatively be called, respectively, an encoder circuit, polar code constructor circuit, interleaver circuit, layer mapper circuit, precoder circuit, channel decomposer circuit, and channel combiner circuit, circuitry, processing element, processor, computational hardware or the like.

As described above, embodiments have been disclosed in the drawings and specification. While the embodiments have been described herein with reference to specific terms, it should be understood that they have been used only for the purpose of describing the technical idea of the inventive concept and not for limiting the scope of the inventive concept as defined in the claims. Further, while the inventive concept has been particularly shown and described with reference to embodiments thereof, it will be understood that various changes in form and details may be made therein without departing from the spirit and scope of the inventive concept as defined by the following claims.

What is claimed is:

1. A method of constructing a polar code for a multiple input multiple output (MIMO) channel, the method comprising:
   generating a plurality of mutually independent single input single output (SISO) channels based on MIMO channel information;
   executing, by at least one processor, operations comprising:
   defining channels of the polar code, and allocating each of the channels of the polar code to one of the plurality of the SISO channels;
   estimating qualities of channels combined by applying polar transformation to the plurality of SISO channels; and
   arranging unfrozen bits and frozen bits based on the estimated qualities.

2. The method of claim 1, wherein the generating of the plurality of SISO channels comprises executing, by the at least one processor, operations comprising: extracting a channel matrix included in the MIMO channel information; and
   obtaining a diagonal matrix having eigenvalues as diagonal elements from the channel matrix based on singular value decomposition.

3. The method of claim 2, wherein the estimating of the qualities of the combined channels comprises calculating a Bhattacharyya parameter of each of the combined channels based on the eigenvalues.

4. The method of claim 1, wherein the allocating comprises grouping the plurality of SISO channels into at least one pair, and the estimating of the qualities of the combined channels comprises applying the polar transformation to the grouped plurality of SISO channels.

5. The method of claim 4, wherein the grouping comprises grouping based on an error rate of a block of a size corresponding to a number of the SISO channels.

6. The method of claim 4, wherein the plurality of SISO channels is r SISO channels, where r is an integer, and the plurality of SISO channels respectively have first through $r^{th}$ indices of the qualities in descending order, and the grouping, for a condition of r being an even number, comprises grouping the plurality of SISO channels into r/2 pairs such that a sum of indices of each pair is (r+1).

7. The method of claim 1, wherein the arranging of the unfrozen bits and the frozen bits comprises determining numbers of the unfrozen bits and the frozen bits according to a code rate, and sequentially arranging the unfrozen bits and the frozen bits in descending order of the estimated qualities.

8. A communication method via a multiple input multiple output (MIMO) channel, the communication method comprising:
   executing, by at least one processor, operations comprising:
   obtaining MIMO channel information;
   constructing a polar code based on the MIMO channel information; and
   performing encoding or decoding according to the polar code,
   wherein the constructing of the polar code comprises allocating each of N channels of the polar code to one of r layers of the MIMO channel, where N and r are positive integers.

9. The communication method of claim 8, wherein the constructing of the polar code further comprises generating r mutually independent single input single output (SISO) channels based on a channel matrix extracted from the MIMO channel information, and the allocating comprises allocating each of a plurality of channels of the polar code to one of the r SISO channels.

10. The communication method of claim 9, wherein the constructing of the polar code further comprises:
    calculating Bhattacharyya parameters of channels combined by applying polar transformation to the r SISO channels; and
    arranging unfrozen bits and frozen bits based on the Bhattacharyya parameters.

11. The communication method of claim 9, wherein the allocating comprises grouping the r SISO channels into N/r pairs based on a probability of block error in a block having a size N.

12. The communication method of claim 11, wherein the r SISO channels respectively have first through $r^{th}$ indices in descending order of signal to noise ratios thereof, and the grouping, for a condition of r being an even number, comprises grouping the r SISO channels into r/2 pairs such that a sum of indices of each pair is (r+1).

13. The communication method of claim 10, wherein the arranging the unfrozen bits and the frozen bits comprises: determining numbers of the unfrozen bits and the frozen bits depending on a code rate; and sequentially arranging the unfrozen bits and the frozen bits in ascending order of the Bhattacharyya parameters.

14. The communication method of claim 9, further comprising applying a precoding matrix generated from the channel matrix to encoded data or applying a receiving matrix generated from the channel matrix to data to be decoded.

15. The communication method of claim 8, wherein the MIMO channel comprises a wireless communication channel generated via multiple antennas and at least one modulator.

16. A communication device communicating via a multiple input multiple output (MIMO) channel, the communication device comprising:
    a polar code constructor circuit configured to construct a polar code based on MIMO channel information;
    an encoder circuit configured to generate N-bit code data by polar coding K-bit source data based on the polar code, where K and N are positive integers; and
    an interleaver circuit configured to generate interleaved data comprising r groups corresponding to r layers of the MIMO channel by interleaving the code data based on the polar code, where r is a positive integer,
    wherein the polar code constructor circuit comprises: a channel decomposer circuit configured to generate r mutually independent single input single output (SISO) channels based on a channel matrix extracted from the MIMO channel; and a channel combiner circuit configured to generate channels combined by applying polar transformation to the r SISO channels.

17. The communication device of claim 16, wherein the channel combiner circuit is configured to calculate Bhattacharyya parameters of the combined channel and arrange unfrozen bits and frozen bits based on the Bhattacharyya parameters.

18. The communication device of claim 16, wherein the r SISO channels respectively have first through $r^{th}$ indices in descending order of signal to noise ratios thereof, and the channel combiner circuit, for a condition of r being an even number, is configured to apply polar transformation to the r SISO channels grouped into r/2 pairs such that a sum of indices of each pair is (r+1).

19. The communication device of claim 16, further comprising: a layer mapper circuit configured to distribute the interleaved data to multiple output terminals of the MIMO channel; and a precoder circuit configured to apply a precoding matrix to data distributed to the multiple output terminals.

* * * * *